(12) United States Patent
Sezer et al.

(10) Patent No.: US 8,321,751 B2
(45) Date of Patent: Nov. 27, 2012

(54) CONFIGURABLE PARALLEL COMPUTATION OF CYCLIC REDUNDANCY CHECK (CRC) CODES

(75) Inventors: Sakir Sezer, Belfast (GB); Ciaran Toal, Belfast (GB)

(73) Assignee: The Queen's University of Belfast, Belfast (GB)

( * ) Notice: Subject to any disclaimer, the term of this patent is extended or adjusted under 35 U.S.C. 154(b) by 871 days.

(21) Appl. No.: 12/298,017

(22) PCT Filed: Apr. 13, 2007

(86) PCT No.: PCT/GB2007/001371
§ 371 (c)(1),
(2), (4) Date: Oct. 21, 2008

(87) PCT Pub. No.: WO2007/122384
PCT Pub. Date: Nov. 1, 2007

(65) Prior Publication Data
US 2010/0058154 A1     Mar. 4, 2010

(30) Foreign Application Priority Data

Apr. 22, 2006 (GB) .................................. 0607976.8

(51) Int. Cl.
*G06F 11/00* (2006.01)
(52) U.S. Cl. ....................................................... 714/758
(58) Field of Classification Search .................... None
See application file for complete search history.

(56) References Cited

U.S. PATENT DOCUMENTS

| 6,721,919 B1 * | 4/2004 | Morioka et al. | 714/801 |
| 2005/0154960 A1 * | 7/2005 | Sydir et al. | 714/758 |

OTHER PUBLICATIONS

Sezer et al., "Reconfigurable Architectures for Network Processing", 2005, IEEE, pp. 75-83.*

* cited by examiner

*Primary Examiner* — Michael Maskulinski
(74) *Attorney, Agent, or Firm* — Foley and Lardner LLP; John D. Lanza

(57) ABSTRACT

An apparatus (1) for implementing a cyclic redundancy check (CRC) error detection methodology to compute a CRC error detection code for data according to the methodology, comprising computation means (2) which uses parallel computation (4) to compute the CRC error detection code, and configurator means (3) which uses the CRC error detection methodology to determine a configuration of the computation means required to compute the CRC error detection code, and configures (25) the computation means accordingly, wherein the configurator means is able to use each of a plurality of CRC error detection methodologies to determine a configuration of the computation means required for parallel computation of a CRC error detection code according to each of the methodologies, and the computation means is configurable to allow configuration thereof for parallel computation of each CRC error detection code.

28 Claims, 2 Drawing Sheets

CONFIGURABLE PARALLEL COMPUTATION OF CYCLIC REDUNDANCY CHECK (CRC) CODES

The invention relates to an apparatus and method for computing an error detection code for data in, for example, a telecommunications network.

In telecommunications networks data integrity is paramount. It is essential that data is transmitted and received accurately. However, for example, noise in the carrier medium can affect transmitted data, adding errors thereto. A number of methodologies have therefore been developed to detect errors in transmitted data.

One such methodology is known as Cyclic Redundancy Check (CRC). This is a well-known and widely-used method of error detection, and is particularly used to detect bit errors within data payloads transmitted using data-link layer protocols. The CRC error detection methodology is used to compute an error detection code for data, and the error detection code is generally appended to the data, and the code and data transmitted together. On receipt of the data and the error detection code, the code is used to determine if an error has occurred in the data during transmission.

Numerous error detection code computation apparatus have been proposed, which have greater or lesser efficacy. However, as with many elements of telecommunications networks, as the usage of such networks continues to grow, improvements in error detection code computation is desirable.

According to a first aspect of the invention there is provided an apparatus for implementing a cyclic redundancy check (CRC) error detection methodology to compute a CRC error detection code for data according to the methodology, comprising computation means which uses parallel computation to compute the CRC error detection code, and configurator means which uses the CRC error detection methodology to determine a configuration of the computation means required to compute the CRC error detection code, and configures the computation means accordingly, wherein the configurator means is able to use each of a plurality of CRC error detection methodologies to determine a configuration of the computation means required for parallel computation of a CRC error detection code according to each of the methodologies, and the computation means is configurable to allow configuration thereof for parallel computation of each CRC error detection code.

As the apparatus can be configured to implement various CRC error detection methodologies, it has the advantage that it can be used in a variety of applications, for which different CRC error detection methodologies will be required. For example, telecommunications networks use a number of transmission protocols, and these generally involve error detection. With the large variance of protocols, with new protocols continually being developed and the need to sustain legacy protocols there is thus a requirement to maximise the protocol coverage of telecommunications networks. One way of maximising the protocol coverage is to incorporate configurability in error detection of the protocols.

The apparatus may comprise a hardware device. The computation means and the configurator means may be implemented on the hardware device.

The computation means may comprise a plurality of configurable elements. The configuration of each element may be determined by the configurator means using one of the CRC error detection methodologies. Each element may receive a part of the data and may be configurable such that it either uses the part of the data in the computation of a CRC error detection code, or does not use the part of the data in the computation of the CRC error detection code.

For each of at least some of the configurable elements, each configurable element may comprise a data-path circuit which may receive a part of the data, and may be configurable such that the circuit either uses the part of the data in the computation of a CRC error detection code, or does not use the part of the data in the computation of the CRC error detection code. At least some of the data-path circuits may comprise an XOR gate. At least some of the data-path circuits may comprise a configurable device, such as a configurable multiplexer. For each of at least some of the data-path circuits, the XOR gate may receive part of the data and may use the data in an XOR function, and the data-path circuit may be configurable such that the part of the data is used in the computation of a CRC error detection code by configuring the configurable device to output a signal resultant from the XOR function of the XOR gate. For each of at least some of the data-path circuits, the XOR gate may receive part of the data and may use the data in an XOR function, and the data-path circuit may be configurable such that the part of the data is not used in the computation of a CRC error detection code by configuring the configurable device not to output a signal resultant from the XOR function of the XOR gate. When a configurable device does not output a signal resultant from an XOR function of an XOR gate, the device may output a signal which has been received by the device. In this case, the configurable element comprising the device may function as an input output connection.

At least some of the configurable elements may each comprise a control-path circuit. At least some of the control-path circuits may comprise a configurable device, such as a configurable multiplexer. At least some of the control-path circuits may comprise a configuration register. For each of at least some of the configurable elements, the control-path circuit of an element may control the configuration of the data-path circuit of the element. For each of at least some of the configurable elements, the control-path circuit of an element may control the configuration of the configurable device of the data-path circuit of the element. For each of at least some of the elements, the configurable device of the control-path circuit of an element may control the operation of the configuration register of the control-path circuit of the element, to control the configuration of the configurable device of the data-path circuit of the element. For each of at least some of the configurable elements, the configurable device of the control-path circuit of an element may be enabled to control operation of the configuration register or disabled.

The configurable elements may comprise an interconnected array of elements. For each row of the array of elements, the elements in a row may be interconnected to collectively compute a part of a CRC error detection code. For each row of the array of elements, data received by each element in a row configured to use the data in the computation of a CRC error detection code may be combined to compute a part of a CRC error detection code. For each row of the array, the elements in a row may be interconnected to receive configuration data from the configurator means. Each column in the array of configurable elements may receive a part of the data for parallel computation of a CRC error detection code. For each column in the array of elements, the elements in a column may be interconnected to each receive a part of the data. For each column in the array of elements, the elements in a column may be interconnected to receive configuration control signals from the configurator means.

The computation means may receive the data in one or more blocks of data. The computation means may comprise two or more input devices to receive the blocks of data. The size of the blocks received by the computation means may be equal to the number of input devices of the computation means. For example, the computation means may provide a number of input devices in the range of 2 to N. The size of the blocks received by the computation means may be less than the number of input devices of the computation means. The or each input device which does not receive data may be programmable to output a low signal. The programmable input devices may comprise programmable multiplexers. The programmable input devices may be programmable in runtime of the apparatus. The computation means may comprise one or more control devices which control programming of the programmable input devices. Providing programmable input devices, means that variable sizes of blocks of data can be received by the computation means. The computation means will thus have a variable input port size. Specifically, the apparatus can provide port sizes of, and therefore receive data blocks in the range 2 to N bits, for example any of 4, 8, 16, 24, 32, 64, 128 and greater bits.

The computation means may comprise one or more output storage devices, such as an output register. The or each output storage device may receive and store a computed error detection code.

The computation means may comprise one or more feedback devices. At least some of the feedback devices may feed a part of a computed CRC error detection code back into the computation means. For example, at least some of the feedback devices may feed a part of a computed CRC error detection code back to at least some of the input devices of the computation means. At least some of the feedback devices may feed a part of a computed CRC error detection code back to at least some of the configurable elements of the computation means. The computation means may comprise one or more control devices used to control feedback of the part of the CRC error detection code into the computation means.

In a preferred embodiment, the computation means computes a first CRC error detection code using a first block of the data, feeds the first CRC error detection code back into the computation means and combines it with a second block of the data, computes a second CRC error detection code using the combined second block of the data and the first CRC error detection code, continues this process until all of the data has been used to compute a final CRC error detection code, and outputs the final CRC error detection code. In this way, all of the data is used to calculate the CRC error detection code.

The computation means may be programmable to receive data comprising a variable number of blocks. This may be achieved by programming appropriate devices of the input devices and programming appropriate devices of the feedback devices of the computation means. For example, the last block of data received by the input devices may be smaller than the blocks previously received. The computation means may be programmable in runtime of the apparatus. The apparatus may be programmed to deal with this variation in the number of bits or byte size of the blocks of input data.

The configurator means may comprise an interface which is used to receive one or more parameters of the CRC error detection methodology used to determine the configuration of the computation means. The configurator means may comprise one or more storage devices, such as registers, which are used to store the parameters. The configurator means may comprise a configuration data calculator which receives the parameters of the CRC error detection methodology and determines the configuration of the computation means. The configurator means may comprise a configuration circuit which feeds configuration signals and configuration control signals to the computation means for configuration thereof.

The configurator means may determine the configuration required for all of the configurable elements of the computation means to compute a CRC error detection code, and configure all of the elements of the computation means together. Alternatively, the configurator means may determine the configuration required for some of the configurable elements of the computation means to compute a CRC error detection code, and configure these elements of the computation means together. When the elements comprise an array, the configurator means may determine the configuration required for the elements in a column to compute a CRC error detection code, and configure all of the elements in the column together. The configurator means may configure the elements of the computation means column by column.

The apparatus may be configurable to implement a plurality of CRC error detection methodologies, each using a CRC generator polynomial of a predetermined size, for example in the range of 4 to M.

The configurator means may use a CRC generator polynomial of a CRC error detection methodology to calculate a CRC D matrix. The D matrix may determine the configuration of the computation means required to compute the CRC error detection code. The configurator means may calculate a row of the D matrix and use this to configure a corresponding column of the array of configurable elements of the computation means. This saves memory in the configurator means as the calculation of each row of the D matrix (with the exception of the first row) is based on the result of the calculation of the previous row. The D matrix may comprise an array of 0s and 1s, and the positions of the 1s may indicate the required location of configurable elements of the computation means which use the data in the computation of the CRC error detection code, and the positions of the 0s may indicate the required locations of configurable elements of the computation means which do not use the data in the computation of the CRC error detection code. The size of the D matrix and therefore the size of the array of the configurable elements, may be determined by the number of the input devices provided by the computation means, and the size, or power, of the CRC generator polynomial of the CRC error detection methodology being used by the apparatus. The number of input devices may determine the number of columns in the array of elements, and the size of the CRC generator polynomial may determine the number of rows in the array of elements.

The apparatus may also be capable of calculating CRC error detection codes using CRC generator polynomials having sizes larger than the port size of the apparatus, by providing a further feedback device. The further feedback device may route part of the computed CRC error detection code into appropriate devices of the feedback devices of the computation means, and the feedback devices may route the computed part of the CRC error detection code into the configurable elements.

The apparatus may be used to compute a CRC error detection code for data to be transmitted. The apparatus may append the computed CRC error detection code to the data, and transmit the data and CRC error detection code together.

The apparatus may be used to compute a CRC error detection code for data which has been received. The apparatus may compute a CRC error detection code for the received data, and compare the computed CRC error detection code with a CRC error detection code received with the data. If the CRC error detection codes are not the same, this indicates an error has occurred in the transmission of the data, and the apparatus may output one or more signals to indicate this.

The apparatus may comprise part of a protocol processor.

According to a second aspect of the invention there is provided a method of computing a CRC error detection code for data according to a CRC error detection methodology, comprising using the apparatus of the first aspect of the invention to implement the CRC error detection methodology and to compute the CRC error detection code.

An embodiment of the invention will now be described by way of example only with reference to the accompanying drawings, in which.

Figure 1:
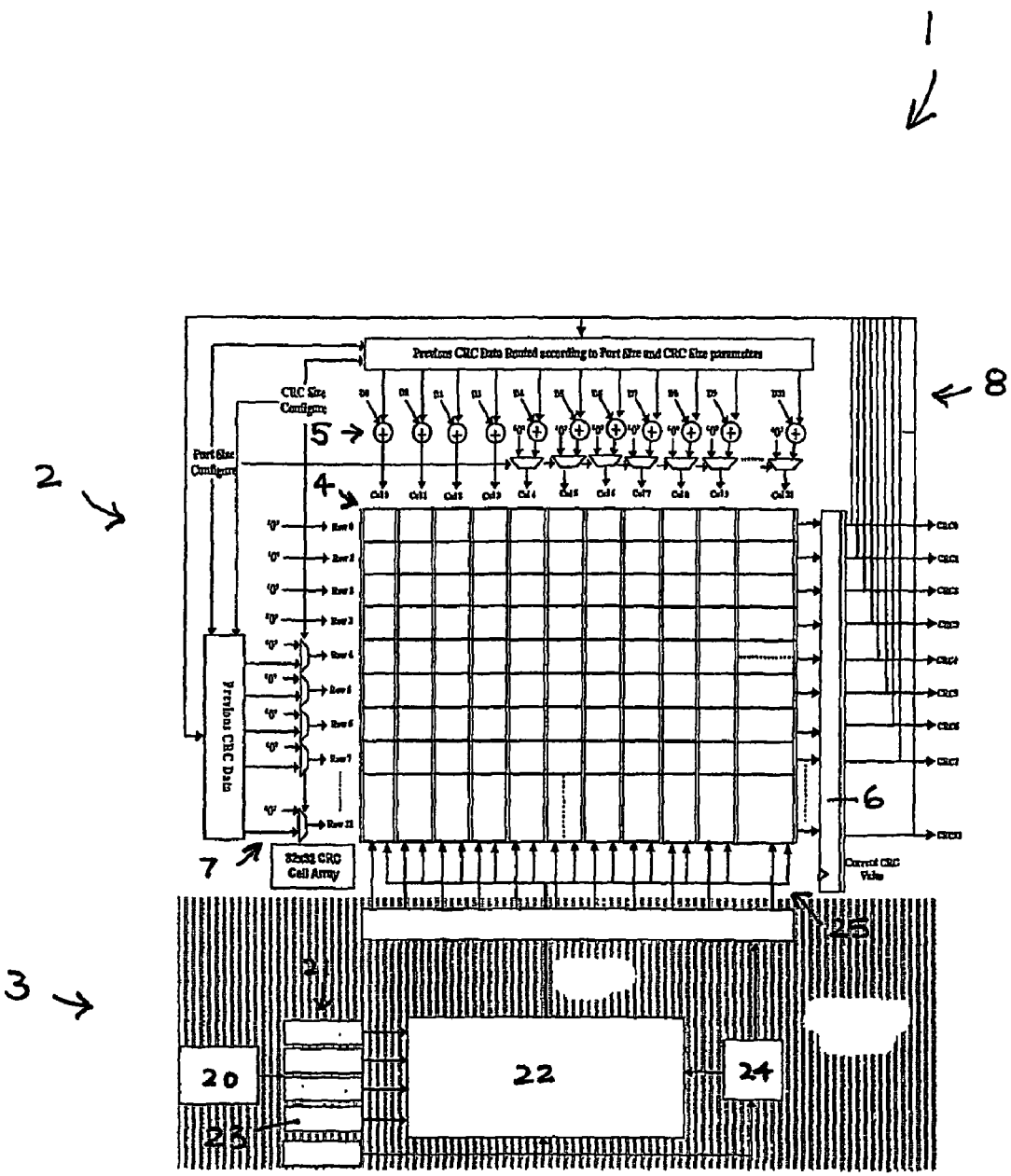
FIG. 1 is a schematic representation of an apparatus according to the first aspect of the invention.

Referring to FIG. 1, the apparatus 1 comprises an error detection code computation means 2 and a configurator means 3. The computation means 2 comprises an array of configurable elements 4. The elements form a matrix of thirty two columns and thirty two rows. It will be appreciated however, that other numbers of columns and rows may be utilised. The computation means further comprises a row of thirty two input ports 5, which each comprise an XOR gate. Input ports five to thirty two further comprise multiplexers, and are therefore programmable. The input ports 5 receive the data for which an error detection code is to be computed, and feed the data to the array of configurable elements 4. The computation means further comprises an output register 6. Each row of the array of configurable elements 4 computes a part of an error detection code, and outputs this to the output register 6. The computation means further comprises a column of programmable feedback multiplexers 7, and a feedback circuit 8. The feedback circuit 8 connects the output register 6 to the input ports 5 and the feedback multiplexers 7, and feeds part of a computed error detection code to the input ports 5 and the feedback multiplexers 7 as required.

Figure 2:
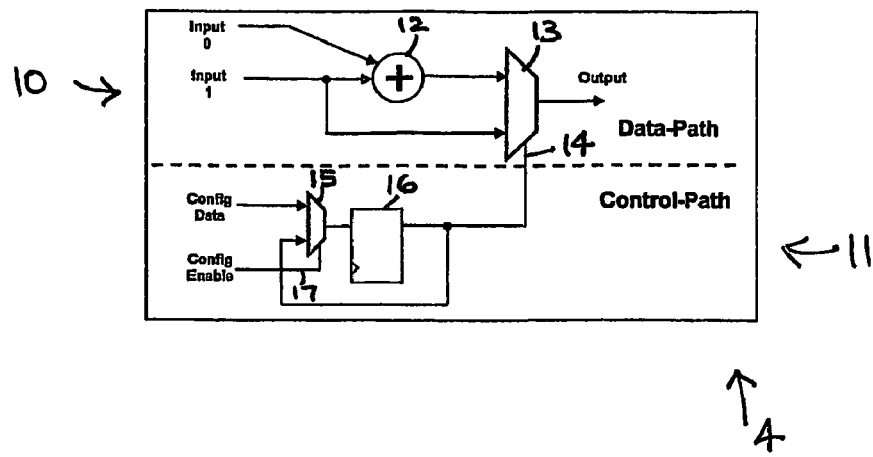
FIG. 2 is a schematic representation of one of the configurable elements of the apparatus of FIG. 1.
Figure 3:
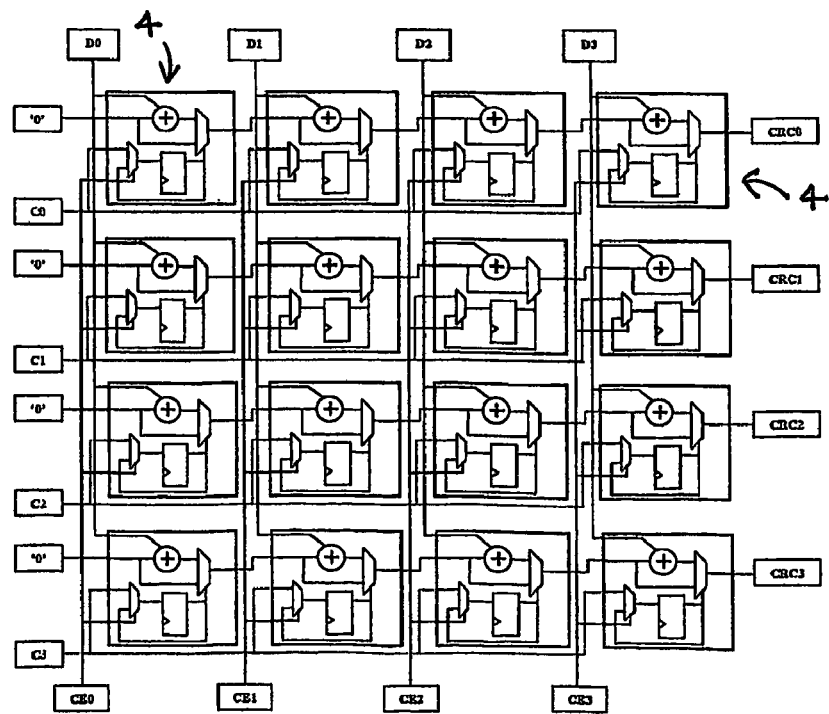
FIG. 3 is a schematic representation of part of the array of configurable elements of the apparatus of FIG. 1.

Referring to FIGS. 2 and 3, the construction of the array of configurable elements 4 will be described in more detail. Each configurable element 4 comprises a data-path circuit 10 and a control-path circuit 11 (FIG. 2). The data-path circuit 10 comprises an XOR gate 12 and a multiplexer 13. The XOR gate 12 comprises two inputs, Input 0 (which receives part of the data for which an error detection code is to be computed) and Input 1, and an output, as shown. The multiplexer 13 also comprises two inputs and one output, as shown. The multiplexer 13 further comprises a control input 14, which is connected to the control-path circuit 11. The output of the XOR gate 12 is connected to a first input of the multiplexer 13, and Input 1 of the XOR gate 12 is connected to a second input of the multiplexer 13.

The control-path circuit 11 comprises a multiplexer 15 and a configuration register 16. The multiplexer 15 comprises two inputs and one output, as shown. The multiplexer 15 also comprises a control input 17. The configuration register comprises one input and one output, as shown. The output of the multiplexer 15 is connected to the input of the register 16, and the output of the register 16 is connected to the control input 14 of the multiplexer 13 of the data-path circuit 10. The output of the register 16 is also connected to one of the inputs of the multiplexer 15.

For each configurable element 4, the multiplexer 15 of the control-path circuit 11 receives a configuration signal on its input labelled Config Data, and when the control input 17 (labelled Config Enable) of the multiplexer receives a high configuration control signal, the configuration signal is fed to the configuration register 16. This outputs the configuration signal (a low signal or a high signal) to the control input 14 of the multiplexer 13 of the data-path circuit 10 of the element 4. A high configuration signal determines that the data-path circuit 10 is configured so that the output of the multiplexer 13 is the result of an XOR function between the part of the data received on Input 0 and the signal received on Input 1 of the XOR gate 12. In this case, the part of the data is used in the computation of the error detection code. A low configuration signal determines that the data-path circuit 10 is configured so that the output of the multiplexer 13 is simply the signal received on Input 1 of the XOR gate 12. In this case, the part of the data received on Input 0 of the XOR gate 12 is not used in the computation of the error detection signal.

The configurable elements 4 are arranged in an interconnected array. FIG. 3 shows how sixteen of the elements 4 are interconnected. It can be seen that, for each row, each of the elements 4 in the row are interconnected. For each row, the output of the multiplexer 13 of the data-path circuit 10 of the first element 4 is connected to Input 1 of the XOR gate 12 of the data-path circuit 10 of the second element 4, and the output of the multiplexer 13 of the data-path circuit 10 of the second element 4 is connected to Input 1 of the XOR gate 12 of the data-path circuit 10 of the third element 4, etc. This connection arrangement is repeated until the last element in the row. For each row, one of the inputs (labelled Config Data) of the multiplexers 15 of the control-path circuits 11 of the elements 4 are connected together, for the receipt of configuration signals. It can also be seen that, for each column, each of the elements 4 in the column are interconnected. For each column, Inputs 0 of the XOR gates 12 of the data-path circuits 10 of the elements 4 are connected to each other, for receipt of data for which an error detection code is to be computed. For each column, the control inputs 17 of the multiplexers 15 of the control-path circuits 11 of the elements 4 are also connected to each other, for receipt of configuration control signals.

Referring again to FIG. 1, the configurator means 3 of the apparatus 1 comprises a microprocessor interface 20, which is connected to an input of each of a number of registers 21. The configurator means 3 further comprises a configuration data calculator 22, which is connected to an output of each of the registers 21. The configurator means 3 also comprises a process control signal generator 23 which has an output connected to the configuration data calculator 22. The configurator means 3 comprises a counter 24, which is connected to the configuration calculator 22. The configurator means 3 further comprises a configuration circuit 25. This comprises an input, connected to the configuration data calculator 22, and a plurality of outputs connected to the computation means 2.

The operation of the apparatus 1 will now be described with reference to a specific Cyclic Redundancy Check (CRC) error detection methodology. CRC is the main error detection methodology used in all telecommunications networks major layer two processing protocols. CRC is a polynomial-based method for detecting errors in data. An error detection code is computed for the data. This is then appended to the data, and a message, comprising the original data and the error detection code, transmitted. At a receiver, the message is analysed to check for errors.

The CRC error detection methodology is based on modulo-2 division of the original data with a chosen CRC generator polynomial. The CRC methodology involves using the chosen CRC generator polynomial to generate a matrix, known as a D matrix. The D matrix determines the configuration required for the array of configurable elements of the error detection code computation means. The D matrix comprises an array of 0s and 1s, the positions of the 1s indicate the required locations of configurable elements in the array which use the data in the computation of the CRC error detection code, and the positions of the 0s indicate the required locations of configurable elements in the array which do not use the data in the computation of the CRC error detection code. The size of the D matrix and therefore the size of the array of the configurable elements, is determined by the number of the input devices provided by the computation means, and the size, or power, of the chosen CRC generator polynomial. The number of input devices determines the number of columns in the array, and the power of the CRC generator polynomial determines the number of rows in the array.

The apparatus of the present embodiment comprises a reconfigurable CRC error detection apparatus, in which the array of configurable elements has thirty two columns and thirty two rows. The apparatus is therefore able to receive data in blocks of up to thirty two bits, in sizes of 4, 8, 16, and 32 bits, and can support error detection code computation for any CRC generator polynomial of up to the power of thirty two.

Computation of an error detection code for data divided into blocks comprising thirty two bits, using a CRC generator polynomial having a power of thirty two will first of all be described. The parameters of the CRC error detection methodology are input into the microprocessor interface 20 of the configurator means 3. These comprise the size i.e. power of the chosen CRC generator polynomial (thirty two), the number of the input devices (thirty two), and the CRC generator polynomial. These are stored in the registers 21, and are output to the configuration data calculator 22. A signal is output from the process control signal generator 23, and the process is initiated that calculates the configuration data and configures the array of configurable elements 4 of the computation means 2. The configurator means 3 first of all calculates the CRC error detection methodology D matrix, using the parameters stored in the registers 21. The D matrix is calculated one row at a time. This reduces the memory required, since the calculation of each row of the matrix (with the exception of the first row) is based on the result of the calculation of the previous row. The configurator means 3 then uses the calculation of each row of the D matrix to determine the configuration data for each corresponding column of the array of configurable elements 4 of the computation means 2. For example, the configurator means 3 uses the calculation of the first row of the D matrix to determine the configuration data for the first column of the array of configurable elements 4 of the computation means 2. Each row of the D matrix will comprise a series of 0s and 1s. For each row, the positions of the 0s and 1s are dictated by the CRC error detection methodology. The positions of the 0s indicate the locations of configurable elements 4 in the corresponding column of the array of configurable elements 4 of the computation means 2, which do not use part of the data in the computation of the error detection code. The positions of the 1s indicate the locations of configurable elements 4 in the corresponding column of the array of configurable elements 4 of the computation means 2, which do use part of the data in the computation of the error detection code.

When the configuration data for a column of the array has been determined, this data is fed to the configuration circuit 25 of the configurator means 3. This circuit uses the configuration data to configure a column of the array of configurable elements 4, via configuration lines, for example lines C0 to C3 of FIG. 3. The configuration data for the column is broadcast to every column in the array, but configuration control signals broadcast on configuration control signal lines, for example lines CE0 to CE3 of FIG. 3, are set high one at a time to ensure that only the desired column of the array is configured. For each configurable element 4 in the column, the control input 17 (Config Enable) of the multiplexer 15 of the control-path circuit 11 receives a high configuration control signal, and the multiplexer 15 receives a configuration signal on its input labelled Config Data. The configuration signal is fed to the configuration register 16, which outputs the configuration signal (a low or high signal) to the control input 14 of the multiplexer 13 of the data-path circuit 10 of the element 4. The configuration signal is low or high according to whether the corresponding entry in the corresponding row of the D matrix is a 1 or a 0. A high configuration signal determines that the multiplexer 13 of the element 4 outputs the result of an XOR function between a data signal received on Input 0 and a signal received on Input 1 of the XOR gate 12 of the element 4. A low configuration signal determines that the multiplexer 13 of element 4 outputs simply the signal received on Input 1 of the XOR gate 12 of the element 4.

Each configurable element 4 in the array of the computation means 2 is configured as above. Instead of having an XOR gate or no XOR gate at each node of the array, as determined by the CRC error detection methodology, a reconfigurable element is provided which comprises an XOR gate and which can be configured to output the result of an XOR function of the XOR gate or not. In this way, any CRC error detection methodology can be catered for by using or not using the XOR gates of appropriate elements in the array.

Once the array of configurable elements 4 of the computation means 2 has been configured according to the chosen CRC error detection methodology, the computation means 2 can be used to calculate an error detection code, for data received by the computation means. The data is received via the input ports 5. The data is received in blocks of thirty two bits, one bit being received by each input port 5. For each block, each bit of incoming data is fed into one configurable element 4 on every row of the array of elements. For example, the bit of data received by the first input port 5 is fed into the first element 4 of each of the rows of the array, and the bit of data received by the second input port 5 is fed into the second element 4 of each of the rows of the array, etc. For each block of data, each bit of data is fed into Input 0 of the XOR gate 12 of the data-path circuit 10 of the element 4.

Each element 4 has been configured to either use the input data bit in the computation of the error detection code or not. For example, consider the first row of the array of elements 4 shown in FIG. 3, and suppose that only the last two elements 4 (left-to-right) have been configured to output the result of an XOR function of their XOR gates. The first bit of data is fed into Input 0 of the XOR gate 12 of the data-path circuit 10 of the first element 4 in the row, and, similarly, the second bit of data is fed into Input 0 of the XOR gate 12 of the data-path circuit 10 of the second element 4 in the row, etc. for all of the elements 4 in the row. A low signal (0) may be fed into Input 1 of the XOR gate 12 of the data-path circuit 10 of the first element 4 in the row. The output of the first element 4 is fed into Input 1 of the XOR gate 12 of the data-path circuit 10 of the second element 4, the output of the second element 4 is fed into Input 1 of the XOR gate 12 of the data-path circuit 10 of the third element 4, and the output of the third element 4 is fed into Input 1 of the XOR gate 12 of the data-path circuit 10 of the fourth element 4. The output of the fourth element 4 comprises the first bit of the first part of the error detection code calculated for the data. The first element 4 in the row is configured to output the signal received on Input 1 of the XOR gate 12, i.e. act as an input output connection, so the low signal received by Input 1 of the XOR gate 12 of this element is fed to the second element 4 of the row. The first data bit which has been received by Input 0 of the XOR gate 12 of the first element 4 is therefore not used in the computation of the error detection code. The second element 4 is also configured to output the signal received on Input 1 of the XOR gate 12, i.e. act as an input output connection, so the low signal is fed on to the third element 4 in the row. The second data bit which has been received by Input 0 of the XOR gate 12 of the second element 4 is therefore not used in the calculation of the error detection code. The third element 4 in the row is configured to output the result of an XOR function of its XOR gate 12, so, for this element, the third data bit received by Input 0 of the XOR gate 12 and the low signal received by Input 1 of the XOR gate 12 are XORed together and the result of the XOR function, the third data bit, is fed to the fourth element 4 of the row. The fourth element 4 in the row is also configured to output the result of an XOR function of its XOR gate, so, for this element, the fourth data bit received by Input 0 of the XOR gate 12 and the third data bit received by Input 1 of the XOR gate 12 are XORed together and output from the fourth element 4 of the row, as the first bit of the first part of the error detection code. The third data bit and the fourth data bit of the first block of data are therefore used in the computation of a first error detection code.

A similar process is carried out for each of the rows of the array of configurable elements 4 of the computation means 2 of FIG. 1, according to the configuration of the elements 4 in each row. For the first data block input into the computation means 2, the output of each row forms one bit of a first error detection code. This is stored in the register 6. The first error detection code is fed back into the input ports 5. A second block of data is fed into the input ports 5. The first error detection code and the second block of data are XORed in the input ports 5. The result is fed into the array of configurable elements 4, and used to compute a second error detection code, as before. The second error detection code is stored in the output register 6, and fed back to the input ports 5. A third block of data is fed into the input ports 5. The second error detection code and the third block of data are XORed in the input ports 5. The result is fed into the array of configurable elements 4, and used to compute a third error detection code. The third error detection code is stored in the output register 6, and fed back to the input ports 5. This process is continued until all of the data has been fed into the input ports 5, and used to calculate an error detection code. The final error detection code is stored in the output register 6. In this way, all of the data is used to calculate the final error detection code.

The above describes an embodiment where the port size of the apparatus 1 is thirty two bits, and the data is divisible into blocks of thirty two bits. The apparatus 1 can provide other port sizes, to receive data in blocks of other sizes. This is achieved by programming the multiplexers of appropriate ones of the 5th to the 32nd input ports 5. Programming of the multiplexers of the input ports 5 can take place during runtime of the apparatus 1. Particularly, the apparatus 1 can provide port sizes of, and therefore receive data blocks of, 4, 8, 12 or 24 bits. For example, if it is desired to receive data in blocks of only 8 bits, i.e. change the port size to eight bits, the multiplexers of the 9th to the 32nd input ports 5 of the apparatus 1 are programmed to feed a low signal (0) into the array of configurable elements 4, instead of feeding data bits into the array. A Port Size Configure signal is generated by the apparatus 1, to control the port size, i.e. programming of the multiplexers of the input ports 5.

In addition, the apparatus 1 can be programmed, in runtime, to receive data comprising a variable number of bytes. This is achieved by programming appropriate multiplexers of the input ports 5 and programming appropriate multiplexers of the feedback multiplexers 7 of the apparatus 1. The Port Size Configure signal generated by the apparatus 1 is also responsible for programming the multiplexers of the input ports 5 and the feedback multiplexers 7 to process variable input data byte sizes. For example, the apparatus may be configured to calculate an error detection code using a CRC error detection methodology having a CRC generator polynomial having a power of thirty two, and the port size of the apparatus may be programmed to be thirty bits. If the last block of data contains only 16 bits to be processed, the Port Size Configure signal causes the apparatus 1 to be programmed to deal with this variation in the number of bits or byte size of the input data. Specifically, the multiplexers of the 17th to 32nd input ports 5 are programmed to feed a low signal (0) into the array of elements 4 of the apparatus 1, and, at the left hand side of the array, the bottom sixteen feedback multiplexers 7 are programmed to receive a previously-calculated error detection code and the previously-calculated error detection code of the 17th to the 32nd rows of the array are routed to the bottom sixteen feedback multiplexers 7. The ability of the apparatus 1 to receive data comprising a variable number of bytes is an important advantage of this apparatus over known error detection devices, as most telecommunications networks use variable-sized byte orientated protocols.

The embodiment described in detail above calculates an error detection code using a CRC generator polynomial having a size, or power, of thirty two. The apparatus is also capable of calculating error detection codes for other CRC generator polynomial sizes, which sizes may be larger than or smaller than the port size of the apparatus. When the CRC generator polynomial size is larger than the port size of the apparatus, an extra feedback bus is provided. This bus routes part of the calculated error detection code into appropriate multiplexers of the feedback multiplexers 7 at the left hand side of the array of configurable elements 4 of the apparatus 1. A low signal is fed into Input 1 of the first element 4 in any row of the array in which no feedback is required. A CRC Size Configure signal is generated by the apparatus 1 to control programming of the feedback multiplexers 7, to cater for the desired size of the CRC polynomial.

The apparatus 1 can then be used to calculate an error detection code for a different CRC error detection methodology, e.g. a CRC error detection code which uses a CRC generator polynomial of power 16. The new CRC error detection methodology is chosen, and the configurator means 3 used to calculate the configuration data for this CRC methodology. The computation means 2 is then reconfigured, and used to calculate the new error detection code. The reconfigurability of the apparatus 1 allows different CRC error detection methodologies to be catered for using only one apparatus.

A programmable apparatus that will support a number of possible CRC generator polynomial sizes, and therefore a number of possible CRC error detection methodologies, is an important advantage of the present invention, and is desirable not only for supporting error detection in data-link layer protocols but also for upper layer protocols and for data encryption.

The apparatus is implemented as a fixed hardware engine. This is used to configure an array of configurable elements, i.e. it performs a function that previously had to be carried out using software.

An implementation of the apparatus 1 has been made using Altera Stratix II FPGA technology. The maximum speed of the implemented apparatus is 117 MHz. At this speed, with full port size utilisation (thirty two bits), this architecture can process 3.77 Gbps. This is highly impressive for an FPGA implementation. This design of apparatus will have most value implemented on an ASIC where the technology shrink will easily enable performance capability of 10 Gbps with full port utilisation. It will be appreciated, however, that other implementations for the apparatus 1 can be used.

The apparatus 1 can be used to calculate an error detection code for either data to be transmitted or data which has been received. For transmission data, the apparatus can append the calculated error detection code to the end of the data and transmit the combined data and code. For received data, the apparatus can calculate the error detection code for the data and compare this with the error detection code appended to the data. If these have the same values, this indicates that no errors occurred in transmission of the data. If these do not have the same values, the apparatus can generate a signal indicating that the data is to be discarded, and that the data should be resent.

The invention claimed is:

1. An apparatus for implementing a cyclic redundancy check (CRC) error detection methodology to compute a CRC error detection code for data according to the methodology, the apparatus comprising:
   computation means comprising a plurality of configurable elements, at least some of which comprise a data path circuit for receiving data and including an XOR gate providing an XOR function and a configurable device, the XOR gate receiving part of the data and using the received part of the data in the XOR function, at least one of the data path circuits configurable either to use the part of the data received by the circuit to compute a CRC error detection code by configuring the configurable device to output a signal resultant from the XOR function of the XOR gate or not to use the part of the data received by the circuit in the computation of the CRC error detection code by configuring the configurable device not to output a signal resultant from the XOR function of the XOR gate, the configurable elements operating in parallel to compute the CRC error detection code, and
   configurator means which uses the CRC error detection methodology to determine a configuration of the computation means required to compute the CRC error detection code, and configures the computation means accordingly, wherein the configurator means is able to use each of a plurality of CRC error detection methodologies to determine a configuration of the computation means required for parallel computation of a CRC error detection code according to each of the methodologies, and the computation means is configurable to allow configuration thereof for parallel computation of each CRC error detection code.

2. The apparatus according to claim 1, in which the configuration of at least some of the configurable elements is determined by the configurator means using one of the CRC error detection methodologies.

3. The apparatus according to claim 1, in which for at least some of the configurable elements, each configurable element receives a part of the data and is configurable such that it either uses the part of the data in the computation of a CRC error detection code, or does not use the part of the data in the computation of the CRC error detection code.

4. The apparatus according to claim 1, in which the configurable device outputs a signal which has been received by the device.

5. The apparatus according to claim 1, in which at least some of the configurable elements each comprise a control-path circuit.

6. The apparatus according to claim 5, in which at least some of the control-path circuits comprise a configurable device.

7. The apparatus according to claim 5, in which at least some of the control-path circuits comprise a configuration register.

8. The apparatus according to claim 5, in which for each of at least some of the configurable elements, the control-path circuit of an element controls the configuration of the data-path circuit of the element.

9. The apparatus according to claim 8, in which for each of at least some of the configurable elements, the control-path circuit of an element controls the configuration of the configurable device of the data-path circuit of the element.

10. The apparatus according to 9, in which for each of at least some of the configurable elements, the configurable device of the control-path circuit of an element controls the operation of the configuration register of the control-path circuit of the element, to control the configuration of the configurable device of the data-path circuit of the element.

11. The apparatus according to claim 1, in which the configurable elements comprise an interconnected array of elements.

12. The apparatus according to claim 11, in which for each row of the array of elements, the elements in a row are interconnected to collectively compute a part of a CRC error detection code.

13. The apparatus according to claim 11, in which for each row of the array of elements, data received by each element in a row configured to use the data in the computation of a CRC error detection code is combined to compute a part of a CRC error detection code.

14. The apparatus according to claim 11, in which for each row of the array, the elements in a row are interconnected to receive con figuration data from the configurator means.

15. The apparatus according to claim 11, in which each column in the array of configurable elements receives a part of the data for parallel computation of a CRC error detection code.

16. The apparatus according to claim 11, in which for each column in the array of elements, the elements in a column are interconnected to receive configuration control signals from the configurator means.

17. The apparatus according to claim 1, in which the computation means receives the data in one or more blocks of data using two or more input devices.

18. The apparatus according to claim 17, in which the size of the blocks received by the computation means is equal to or less than the number of input devices of the compulsion means.

19. The apparatus according to claim 18, in which the or each input device which does not receive data is programmable to output a low signal.

20. The apparatus according to claim 1, in which the computation means comprises one or more feedback devices at least some of which feed a part of a computed CRC error detection code hack into the computation means.

21. The apparatus according to claim 20, in which the computation means computes a first CRC error detection code using a first block of the data, feeds the first CRC error detection code back into the computation means and combines it with a second block of the data, computes a second CRC error detection code using the combined second block of the data and the first CRC error detection code, continues this process until all of the data has been used to compute a final CRC error detection code, and outputs the final CRC error detection code.

22. The apparatus according to claim 20, in which the computation means is programmable to receive data comprising a variable number of blocks, by programming appropriate devices of the input devices and programming appropriate devices of the feedback devices of the computation means.

23. The apparatus according to claim 1, which is configurable to implement a plurality of CRC error detection methodologies, each using a CRC generator polynomial of a predetermined size.

24. The apparatus according to claim 23, in which the configurator means uses a CRC generator polynomial of a CRC error detection methodology to calculate a CRC D matrix, winch determines the configuration of the computation means required to compute the CRC error detection code.

25. The apparatus according to claim 24, in which the D matrix comprises an array of 0s and 1s, and the positions of the 1s indicates the required location of configurable elements of the computation means which use the data in the computation of the CRC error detection code, and the positions of the 0s indicates the required locations of configurable elements of the computation means which do not use the data in the computation of the CRC error detection code.

26. The apparatus according to claim 1, which comprises a hardware device.

27. The apparatus according to claim 1, which comprises part of a protocol processor.

28. A method of computing a cyclic redundancy check (CRC) error detection code for data according to a CRC error detection methodology, the method comprising:

providing an apparatus to implement a CRC error detection methodology and to compute a CRC error detection code, the apparatus comprising computation means comprising a plurality of configurable elements, at least some of which comprise a data path circuit for receiving data and including an XOR gate providing an XOR function and a configurable device, the XOR gate receiving part of the data and using the received part of the data in the XOR function, at least one of the data path circuits configurable either to use the part of the data received by the circuit to compute a CRC error detection code by configuring the configurable device to output a signal resultant from the XOR function of the XOR gate or not to use the part of the data received by the circuit in the computation of the CRC error detection code by configuring the configurable device not to output a signal resultant from the XOR function of the XOR gate, configurable elements operating in parallel to compute the CRC error detection code, using, by a configurator means, CRC error detection methodology to determine a configuration of the computation means required to compute the CRC error detection code, and configuring, by the configurator means, the computation means accordingly, wherein the configurator means is able to use each of a plurality of CRC error detection methodologies to determine a configuration of the computation means required for parallel computation of the CRC error detection code according to each of the methodologies, and the computation means is configurable to allow configuration thereof for parallel computation of each CRC error detection code.

* * * * *